United States Patent
Lu

(10) Patent No.: US 9,679,094 B2
(45) Date of Patent: Jun. 13, 2017

(54) DETERMINING CORRELATION COEFFICIENT(S) AMONG DIFFERENT FIELD EFFECT TRANSISTOR TYPES AND/OR AMONG DIFFERENT ELECTRICAL PARAMETER TYPES

(71) Applicant: International Business Machines Corporation, Armonk, NY (US)

(72) Inventor: Ning Lu, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 128 days.

(21) Appl. No.: 14/699,405

(22) Filed: Apr. 29, 2015

(65) Prior Publication Data
US 2016/0321391 A1 Nov. 3, 2016

(51) Int. Cl.
*G06F 17/50* (2006.01)
(52) U.S. Cl.
CPC ...... *G06F 17/5063* (2013.01); *G06F 17/5036* (2013.01)
(58) Field of Classification Search
CPC ............. G06F 17/5009; G06F 17/5022; G06F 17/5027; G06F 17/5036; G06F 17/5045; G06F 17/5063
USPC .................................. 716/106, 136; 703/14
See application file for complete search history.

(56) References Cited

U.S. PATENT DOCUMENTS

| | | | |
|---|---|---|---|
| 5,365,463 A | 11/1994 | Donath et al. | |
| 6,330,526 B1 | 12/2001 | Yasuda | |
| 8,010,930 B2 | 8/2011 | Trombley et al. | |
| 8,176,463 B2 | 5/2012 | O'Riordan et al. | |
| 8,423,341 B2 | 4/2013 | Lu | |
| 8,682,466 B2 | 3/2014 | Ko et al. | |
| 8,954,908 B1 * | 2/2015 | Liu | G06F 17/5036 703/14 |

(Continued)

OTHER PUBLICATIONS

Park et al., "Simulating CMOS Circuits Containing Multiple FET Types Including the Geometric Dependence of Correlation Among Different FET Types," NSTI—Nanotech 2007, ISBM 1420061844, vol. 3, pp. 562-565.

(Continued)

*Primary Examiner* — Paul Dinh
(74) *Attorney, Agent, or Firm* — Gibb & Riley, LLC; Steven J. Meyers

(57) ABSTRACT

A system, method and computer program product for determining correlation coefficient(s) among different field effect transistor types for a same electrical parameter type and/or among different electrical parameter types for a same field effect transistor type. The correlation coefficient(s) are determined based on the results of a limited number of simulation runs. Specifically, the number of simulation runs required by the disclosed embodiments is limited to one plus the product of the number of different field effect transistor types at issue, the number of different electrical parameter types at issue and the number of statistical process parameter types that impact the different electrical parameter types. Such correlation coefficient(s) can subsequently be used to develop a compact model of a semiconductor process technology. This compact model can then be used to perform variation-aware design of an integrated circuit chip.

20 Claims, 5 Drawing Sheets

(56) References Cited

U.S. PATENT DOCUMENTS

| | | | |
|---|---|---|---|
| 9,268,885 B1* | 2/2016 | Wang | G06F 17/5009 |
| 2008/0127005 A1* | 5/2008 | Lin | G06F 17/5036 |
| | | | 716/115 |
| 2010/0153086 A1* | 6/2010 | Satoh | G06F 17/5036 |
| | | | 703/14 |
| 2012/0221376 A1 | 8/2012 | Austin | |
| 2016/0300004 A1* | 10/2016 | Barker | G06F 17/5045 |

OTHER PUBLICATIONS

Cheng et al., "Statistical-Variability Compact-Modeling Strategies for BSIM4 and PSP," IEEE Design & Test of Computers, 2010, pp. 26-35.

Samar K. Saha, "Compact MOSFET Modeling for Process Variability-Aware VLSI Circuit Design," IEEE Access, vol. 2, 2014, pp. 104-113.

* cited by examiner

| Sim. Run | NFET Phig | PFET Phig | NFET Spacer W | PFET Spacer W | NFET Channel L | PFET Channel L |
|---|---|---|---|---|---|---|
| 1 Initial Run | Nom | Nom | Nom | Nom | Nom | Nom |
| 2 | Corner | Nom | Nom | Nom | Nom | Nom |
| 3 | Nom | Corner | Nom | Nom | Nom | Nom |
| 4 | Nom | Nom | Corner | Nom | Nom | Nom |
| 5 | Nom | Nom | Nom | Corner | Nom | Nom |
| 6 | Nom | Nom | Nom | Nom | Corner | Nom |
| 7 | Nom | Nom | Nom | Nom | Nom | Corner |

FIG. 2

No correlation,
$r_{NFET, PFET, Phig} = 0$

Partial correlation,
$r_{NFET, PFET, Spacer\ W} = 0.6$

Perfect correlation,
$r_{NFET, PFET, Channel\ L} = 1$

DETERMINING CORRELATION COEFFICIENT(S) AMONG DIFFERENT FIELD EFFECT TRANSISTOR TYPES AND/OR AMONG DIFFERENT ELECTRICAL PARAMETER TYPES

BACKGROUND

The embodiments disclosed herein relate to compact model development for variability-aware integrated circuit (IC) design and, more particularly, to an efficient technique for determining, for use in compact model development, correlation coefficient(s) among different field effect transistor (FET) types for a same electrical parameter type and/or among different electrical parameter types for a same FET type.

A correlation coefficient is a measure of the strength and the direction of the linear relationship between to two statistical variables. Correlation coefficients are often used in compact model development for variation-aware integrated circuit (IC) design. These correlation coefficients can be among different field effect transistor (FET) types for a same electrical parameter type and/or among different electrical parameter types for a same FET type. Such correlation coefficients are almost always determined from a sample of statistical data, which is either numerically simulated by performing a large number of Monte Carlo simulation runs or actually measured from hardware (i.e., from many manufactured IC chips). Performing such Monte Carlo simulation runs and/or acquiring hardware measurements can be time consuming and costly. Therefore, there is a need in the art for a more efficient technique for determining these correlation coefficients.

SUMMARY

In view of the foregoing, disclosed herein are embodiments of a system, method and computer program product for determining correlation coefficient(s) among different field effect transistor (FET) types for a same electrical parameter type and/or among different electrical parameter types for a same FET type. In the embodiments, the correlation coefficient(s) are determined based on the results of a limited number of simulation runs. Specifically, the number of simulation runs required by the disclosed embodiments is limited to one plus the product of the number of different FET types at issue, the number of different electrical parameter types at issue and the number of statistical process parameter types that impact the different electrical parameter types. Such correlation coefficient(s) can subsequently be used in compact model development for variation-aware integrated circuit design. Since the disclosed technique requires only a limited number of simulation runs to determine the correlation coefficient(s), it is much more efficient in terms of time and costs than techniques which require Monte Carlo simulation runs to be performed and/or that require hardware measurements to be acquired.

More particularly, disclosed herein is a computer system for determining at least one electrical correlation coefficient among different field effect transistor (FET) types for a same electrical parameter type and/or among different electrical parameter types for a same field effect transistor type. This computer system can comprise at least a user interface, a memory and a processor in communication with the memory.

The user interface can receive a plurality of inputs (e.g., menu selections). These inputs can indicate a first number (I) of field effect transistor types, a second number (M) of electrical parameter types and a third number (K) of statistical process parameter types. It should be noted that the first number (i.e., the number of different field effect transistor types at issue) and/or the second number (i.e., the number of different electrical parameter types at issue) can be greater than one so that multiple FET types and/or multiple electrical parameter types are considered.

In any case, the inputs can be stored in memory and accessed and used by the processor when performing simulation runs.

Specifically, the processor can perform an initial simulation run (e.g., an initial technology computer-aided design (TCAD) simulation run) for each electrical parameter type and each FET type, as indicated by the inputs, (i.e., for each different combination of a specific electrical parameter type and a specific FET type). Specifically, this initial simulation run can be performed with all of the third number (K) of statistical process parameter types for all of the first number (I) of the FET types being set at corresponding nominal process parameter values in order to determine corresponding nominal electrical parameter values for each of the second number (M) of the electrical parameter types for each of the first number (I) of the FET types (i.e., for each different combination of a specific electrical parameter type and a specific FET type).

The processor can further perform a predetermined number of additional simulation runs (e.g., additional TCAD simulation runs) for each electrical parameter type and each FET type (i.e., for each different combination of a specific electrical parameter type and a specific FET type). Specifically, each additional simulation run can be a corner simulation run. Each additional simulation run can be performed with all except a selected one of the third number (K) of the statistical process parameter types for a selected one of the first number (I) of the FET types being set at their corresponding nominal process parameter values and with the selected one of the third number (K) of the statistical process parameter types for the selected one of the first number (I) of the FET types being set at a corresponding corner process parameter value. Each subsequent additional simulation run will be performed in the exact same manner except that a different one the third number (K) of the statistical process parameter types for one of the FET types will be set at its corresponding corner process parameter value, while all others are set at their corresponding nominal process parameter values. Thus, the number of additional simulation runs will be a predetermined number of additional simulation runs equal to the product of the first number (I), the second number (M) and the third number (K) and these additional simulation runs will be performed to determine corner electrical parameter values for each of the second number (M) of electrical parameter types for each the first number (I) of FET types (i.e., for each different combination of a specific electrical parameter type and a specific FET type).

The processor can then use the results of the initial simulation run and the additional simulation runs to determine at least one electrical correlation coefficient among each pair of different FET types in the first number (I) of FET types for a specific electrical parameter type (when the first number (I) of FET types is greater than one) and/or among each pair of different electrical parameter types in the second number (M) of electrical parameter types for a specific FET type (when the second number (M) of electrical parameter types is greater than one).

Additionally, the processor can use the acquired correlation coefficient(s) to develop a compact model of a semiconductor process technology. The compact model can then be used to perform variation-aware design of an integrated circuit chip.

Also disclosed herein is a method for determining at least one electrical correlation coefficient among different field effect transistor (FET) types for a same electrical parameter type and/or among different electrical parameter types for a same FET type.

This method can comprise receiving a plurality of inputs (e.g., a plurality of menu selections) through a user interface of a computer system. These inputs, which can be stored in memory, can indicate a first number (I) of FET types, a second number (M) of electrical parameter types and a third number (K) of statistical process parameter types. It should be noted that the first number (i.e., the number of different FET types at issue) and/or the second number (i.e., the number of different electrical parameter types at issue) can be greater than one so that multiple FET types and/or multiple electrical parameter types are considered.

The inputs can be accessed by a processor of the computer system from the memory and used when performing simulation runs. Specifically, the method can comprise performing, by the processor, an initial simulation run (e.g., an initial technology computer-aided design (TCAD) simulation run) for each FET type and each electrical parameter type indicated by the inputs. Specifically, this initial simulation run can be performed with all of the third number (K) of statistical process parameter types for all of the first number (I) of the field effect transistor types being set at corresponding nominal process parameter values in order to determine corresponding nominal electrical parameter values for each of the second number (M) of the electrical parameter types for each of the first number (I) of the field effect transistor types.

The method can further comprise performing, by the processor, a predetermined number of additional simulation runs (e.g., additional TCAD simulation runs) for each field effect transistor type and each electrical parameter type. Specifically, each additional simulation run can be a corner simulation run. Each additional simulation run can be performed with all except a selected one of the third number (K) of the statistical process parameter types for a selected one of the first number (I) of the field effect transistor types being set at their corresponding nominal process parameter values and with the selected one of the third number (K) of the statistical process parameter types for the selected one of the first number (I) of the field effect transistor types being set at a corresponding corner process parameter value in order to determine corresponding corner electrical parameter values for the each of the second number (M) of the electrical parameter types for the each of the first number of the field effect transistor types. Each subsequent additional simulation run will be performed in the exact same manner except that a different one the third number (K) of the statistical process parameter types for one of the field effect transistor types will be set at its corresponding corner process parameter value, while all others are set at their corresponding nominal process parameter values. Thus, the number of additional simulation runs will be a predetermined number of additional simulation runs equal to the product of the first number (I), the second number (M) and the third number (K).

The method can then comprise using, by the processor, the results of the initial simulation run (i.e., the nominal electrical parameter value(s) for each electrical parameter type at issue) and the results of the additional simulation runs (i.e., the corner electrical parameter value(s) for each electrical parameter type at issue) to determine at least one electrical correlation coefficient among each pair of different field effect transistor types in the first number (I) of field effect transistor types for a specific electrical parameter type (when the first number (I) of field effect transistor types is greater than one) and/or among each pair of different electrical parameter types in the second number (M) of electrical parameter types for a specific field effect transistor parameter types for a specific field effect transistor is greater than one). Additionally, the method can comprise subsequently using the acquired correlation coefficient(s) to develop a compact model of a semiconductor process technology. The compact model is can then be used to perform variation-aware design of an integrated circuit chip.

Also disclosed herein is a computer program product. This computer program product can comprise a computer readable storage medium having program code embodied therewith. The program code can be executable by a processor to perform the above-described method.

BRIEF DESCRIPTION OF THE DRAWINGS

The embodiments herein will be better understood from the following detailed description with reference to the drawings, which are not necessarily drawn to scale and in which:

FIG. 2 is a table illustrating exemplary process parameter value settings for different simulation runs;

DETAILED DESCRIPTION

As mentioned above, a correlation coefficient is a measure of the strength and the direction of the linear relationship between to two statistical variables. Correlation coefficients are often used in compact model development for variation-aware integrated circuit (IC) design. These correlation coefficients can be among different field effect transistor (FET) types for a same electrical parameter type and/or among different electrical parameter types for a same FET type. Such correlation coefficients are almost always determined from a sample of statistical data, which is either numerically simulated by performing a large number of Monte Carlo simulation runs or actually measured from hardware (i.e., from many manufactured IC chips). Performing such Monte Carlo simulation runs and/or acquiring hardware measurements can be time consuming and costly. Therefore, there is a need in the art for a more efficient technique for determining these correlation coefficients.

In view of the foregoing, disclosed herein are embodiments of a system, method and computer program product for determining correlation coefficient(s) among different field effect transistor (FET) types for a same electrical parameter type and/or among different electrical parameter types for a same FET type. In the embodiments, the correlation coefficient(s) are determined based on the results of a limited number of simulation runs. Specifically, the number of simulation runs required by the disclosed embodiments is limited to one plus the product of the number of different FET types at issue, the number of different electrical parameter types at issue and the number of statistical process parameter types that impact the different electrical parameter types. Such correlation coefficient(s) can subsequently be used in compact model development for variation-aware integrated circuit design. Since the disclosed technique requires only a limited number of simulation runs to determine the correlation coefficient(s), it is much more efficient in terms of time and costs than techniques which require Monte Carlo simulation runs to be performed and/or that require hardware measurements to be acquired.

Figure 1:
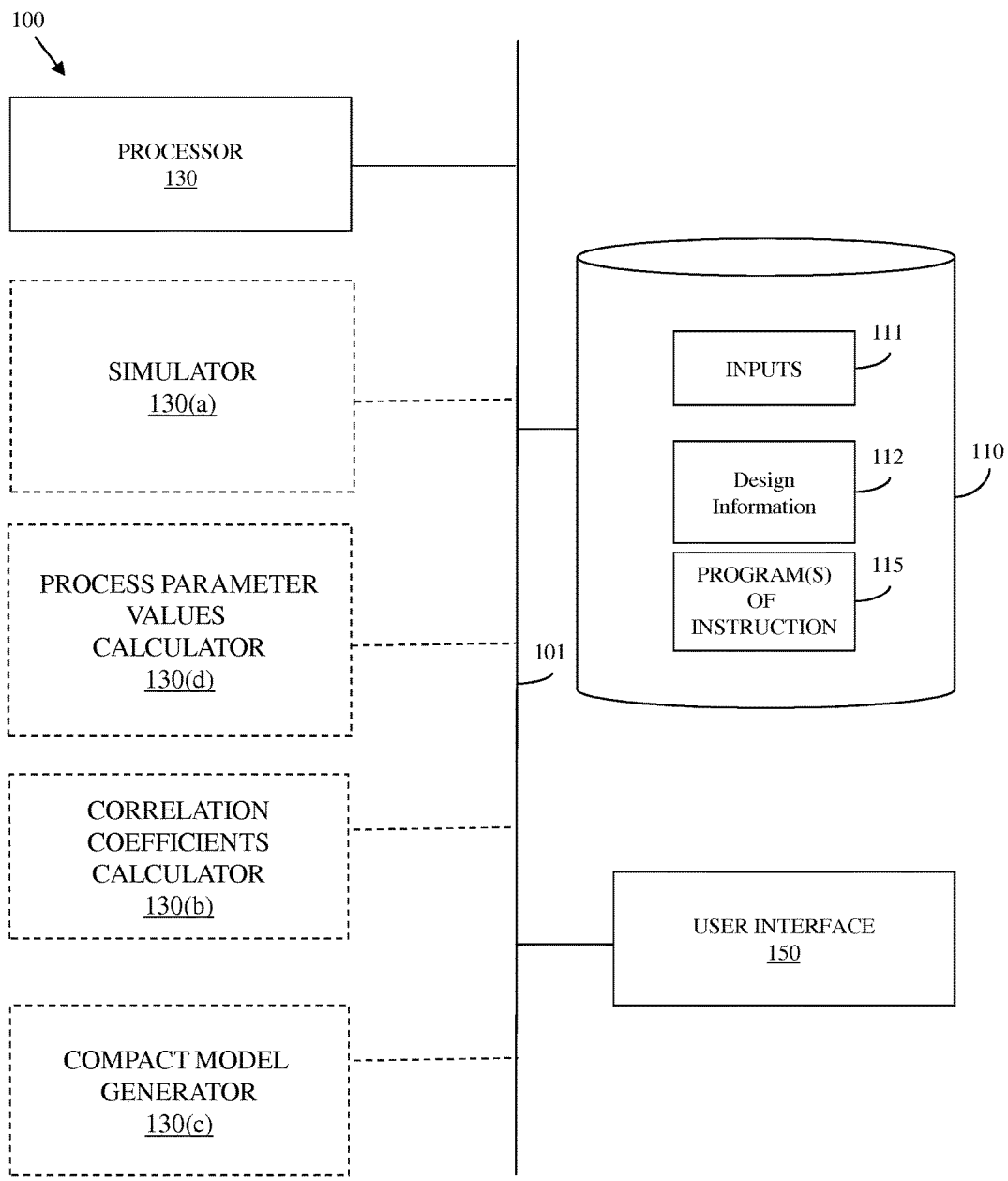
FIG. 1 is a schematic diagram illustrating a system for determining at least one correlation coefficient among different field effect transistor (FET) types for a same electrical parameter type and/or among different electrical parameter types for a same FET type.

More particularly, referring to FIG. 1, disclosed herein is a computer system 100 for determining at least one correlation coefficient among different field effect transistor (FET) types for a same electrical parameter type and/or among different electrical parameter types for a same FET type. It should be noted that correlation coefficients among different FET types for a same electrical parameter type and correlation coefficients among different electrical parameter types for a same FET type are referred to herein as electrical correlation coefficients. This computer system 100 can comprise: at least a user interface 150; at least one memory 110 (e.g., at least one computer readable storage medium, such as a computer readable storage device), which stores program(s) of instruction 115, user inputs 111 and any other information 112 required for variation-aware integrated circuit design; and at least one processor (e.g., 130 or 130(a)-(d), see detailed discussion below). These system components can communicate, for example, over a system bus 101, as illustrated. Alternatively, any one or more of the system components can communicate with any other system component over a wired or wireless network.

The computer system 100 can comprise a single specialized processor 130 (e.g., a single specialized processing unit) that, prior to and during development of a compact model of a semiconductor process technology, performs (i.e., that is adapted to perform, that is configured to perform and/or that executes multiple programs of instructions 115 to perform) multiple process steps, as described in detail below. Alternatively, the system 100 can comprise multiple specialized processors 130(a)-(d) (e.g., multiple different special specialized processing units) and, prior to and during development of a compact model of a semiconductor process technology, each processor performs (i.e., is adapted to perform, is configured to perform and/or executes one or more specific programs of instructions 115 to perform) one or more of the multiple process steps, as described in detail below. For purposes of illustration, three different special purpose processor(s) are shown in FIG. 1 including a simulator 130(a), correlation coefficients calculator 130(b), a compact model generator 130(c) and a process parameter values calculator 130(d). It should be understood that FIG. 1 is not intended to be limiting and, alternatively, the multiple process steps, as described in detail below, can be performed by any number of one or more processors.

In any case, the user interface 150 (e.g., a graphical user interface (GUI)) can receive a plurality of inputs 111 (e.g., menu selections) from a user and those inputs 111 can be stored in memory 110.

The inputs 111 can indicate a specific FET type or multiple specific FET types to be considered and, thus, can indicate a first number (I) of FET types. That is, if one specific FET type is indicated by the inputs 111, then first number (I) is one; if two specific FET types are indicated by the inputs 111, then first number (I) is two; and so on. The type of field effect transistor can simply refer to the conductivity type of the field effect transistor (e.g., an N-type field effect transistor (NFET) or a P-type field effect transistor (PFET)). Additionally or alternatively, the type of field effect transistor can refer to some other property or characteristic that distinguishes the field effect transistors at issue (e.g., threshold voltage level type, gate dielectric thickness level type and/or any other suitable property or characteristic that distinguishes the field effect transistors at issue). For example, the type of field effect transistor can refer to both the conductivity type and the threshold voltage level type such as, a regular threshold voltage (RVT) NFET, a RVT PFET, a high threshold voltage (HVT) NFET, a HVT PFET, a mezzanine threshold voltage (MVT) NFET, a MVT PFET, a super-high threshold voltage (SHVT) NFET, a SHVT PFET, a low threshold voltage (LVT) NFET, a LVT PFET, a ultra-high threshold voltage (UHVT) NFET, a UHVT PFET, and so on. Additionally or alternatively, the type of field effect transistor can refer to gate dielectric thickness level type (e.g., EGNFET or EGPFETs with mid-oxide thickness; DGNFETs or DGPFETs with thick oxide thickness; and so on).

The inputs 111 can also indicate a specific electrical parameter type or multiple specific electrical parameter types to be considered and, thus, can indicate a second number (M) of electrical parameter types. That is, if one specific electrical parameter type is indicated by the inputs 111, then second number (M) is one; if two specific electrical parameter types are indicated by the inputs 111, then second number (M) is two; and so on. The type of electrical parameter can be any electrical property exhibited by a field effect transistor. For example, different electrical parameter types can include, but are not limited to, saturation threshold voltage ($V_{tsat}$), linear threshold voltage ($V_{tlin}$), effective drain current ($I_{d,eff}$), low drain current ($I_{d,low}$), high drain current ($I_{d,high}$), off current ($I_{off}$), gate resistance ($R_{gate}$), and overlap capacitance ($C_{ov}$).

It should be noted that for purposes of determining the electrical correlation coefficient(s) mentioned above (i.e., at least one correlation coefficient among different FET types for a same electrical parameter type and/or at least one correlation coefficient among different electrical parameter types for a same FET type) using the technique disclosed herein, the first number (I) of FET types should be greater than one and/or the second number (M) of electrical parameter types should be greater than one. Specifically, the first number (I) of field effect transistors should be greater than one to determine at least one electrical correlation coefficient among different FET types for a same electrical parameter type, the second number (M) of electrical parameter types should be greater than one to determine at least one electrical correlation coefficient among different electrical parameter types for a same FET type, and both the first number (I) of FET types and the second number (M) of electrical parameter types should be greater than one to determine electrical correlation coefficients among different FET types for different electrical parameter types.

The inputs 111 can also indicate specific statistical process parameter types to be considered and, thus, can indicate a third number (K) of statistical process parameter types. The statistical process parameter types can be process parameters that have been identified as having an impact on any one or more of the specific electrical parameter type(s). That is, variations in any one or more of these statistical process parameter types can cause variations in one or more of the electrical parameter types. The specific statistical process parameter types can, for example, include any one or more of the following: channel length, channel width (in planar FETs), semiconductor fin height (in FinFETs), semiconductor fin thickness (in FinFETs), gate dielectric thickness, gate work function, FET component doping (e.g., source/drain region doping, channel region doping, halo region doping, polysilicon gate doping, etc.), etc.

In any case, the inputs 111 can be accessed and used by the processor 130 (or, if applicable, the processors 130(a)-(c) as described below.

It should be noted that for purposes of this disclosure the letter i refers to a specific FET type and, if a comparison between two FET types is required for a given process step, the letter j also refers to a specific FET type. Similarly, the letter m refers to a specific electrical parameter type and, if a comparison between two electrical parameter types is required for a given process step, the letter n also refers to a specific electrical parameter type. The letter k refers to a specific statistical process parameter type.

The processor 130 (or, if applicable, the process parameter values calculator 130(d)) can determine the following: (a) corresponding nominal process parameter values for each of the K statistical process parameter types for each of the I FET types (i.e., for each different combination of a specific statistical process parameter type k and a specific FET type i) based on the definition of the semiconductor technology at issue; and (b) corresponding standard deviations ($\sigma_{i,k}$) for each of the K statistical process parameter types for each of the I FET types (i.e., for each different combination of a specific statistical process parameter type k and a specific FET type i) based on the semiconductor process/manufacturing capability. The corresponding nominal process parameters and the corresponding standard deviations for each of the K statistical process parameter types for each of the I field effect transistor types ($\sigma_{i,k}$) can stored with design information 112 in memory 110.

The processor 130 (or, if applicable, the simulator 130(a)) can perform an initial simulation run (e.g., an initial technology computer-aided design (TCAD) simulation run) for each FET type and each electrical parameter type indicated by the inputs 111 (i.e., for each different combination of a specific electrical parameter type m and a specific FET type i). This initial simulation run is performed with all of the K statistical process parameter types for all of the I FET types being set at their corresponding nominal process parameter values in order to determine corresponding nominal electrical parameter values $E_{i,m,nom}$ for each m of the M electrical parameter types for each i of the I FET types (i.e., for each different combination of a specific electrical parameter type m and a specific FET type i).

The processor 130 (or, if applicable, the simulator 130(a)) can further perform a predetermined number of additional simulation runs (e.g., additional TCAD simulation runs) for each electrical parameter type and each FET type (i.e., for each different combination of a specific electrical parameter type m and a specific FET type i). Specifically, each additional simulation run can be a corner simulation run. Each additional simulation run can be performed with all except a selected one k of the K statistical process parameter types for a selected one i of the I FET types being set at their corresponding nominal process parameter values and with the selected one k of the K statistical process parameter types for the selected one i of the I FET types being set at its corresponding corner process parameter value. Each subsequent additional simulation run will be performed in the exact same manner except that the selected statistical process parameter type-FET type combination for which a corner process parameter value is used is shifted. That is, during each subsequent additional simulation run, a different statistical process parameter type for the same FET type or the same statistical process parameter type for a different FET type will be set at its corresponding corner process parameter value, while all others are set at their corresponding nominal process parameter values. Such additional simulation runs are performed until all I·K combinations are considered. For each of such I·K combinations, M simulation runs are performed and each simulation determines a corner value of one electrical parameter as a result of a change in one statistical process parameter. Thus, the number of additional simulation runs will be a predetermined number of additional simulation runs equal to the product of the first number (I), the second number (M) and the third number (K) and these additional simulation runs will be performed to determine corner electrical parameter values for each of the M electrical parameter types for each of the I FET types with respect to each of the K statistical process parameter types.

It should be noted that, in each additional simulation run, the corner process parameter value used for the selected statistical-process-parameter type-FET-type combination should be a set multiple x (e.g., x being 1, 2, 3, −1, −2, or −3) of the corresponding standard deviation (i.e., $x\sigma_{i,k}$) from the corresponding nominal process value of that specific statistical process parameter of that specific FET type. This multiple x can be the same for all runs.

The processor 130 (or, if applicable, the correlation coefficients calculator 130(b)) can then use the results of the initial simulation run (i.e., the nominal electrical parameter value(s) for each different combination of a specific electrical parameter type m and a specific FET type i), the results of the additional I·M·K simulation runs (i.e., the corner electrical parameter values for each different combination of a specific electrical parameter type m and a specific FET type i), and the corresponding standard deviations ($\sigma_{i,k}$) to first determine I·M·K sensitivity values and then to determine the electrical correlation coefficient(s) among each pair of different FET types in the I FET types for a specific electrical parameter type (when I is greater than one) and/or among each pair of different electrical parameter types in the M electrical parameter types for a specific FET type (when M is greater than one).

Specifically, for each one m of the M electrical parameter types for each one i of the I FET types (i.e., for each different combination of a specific electrical parameter type m and a specific FET type i), the corresponding nominal electrical parameter values $E_{i,m}$ acquired during the initial simulation run and the corresponding corner electrical parameter values $E_{i,m}$ acquired during the additional simulation runs can be used to solve the following equation for determining sensitivity values ($s_{i,m,k}$) with respect to each of the third number (K) statistical process parameter types, where each sensitivity value ($s_{i,m,k}$) indicates how sensitive the value of the mth electrical parameter of the ith type of field effect transistor is with respect to a change in the value of the kth statistical process parameter k:

$$s_{i,m,k} = \quad (1)$$
$$\frac{1}{x\sigma_{i,k}}[E_{i,m}(p_{i,1,nom}, \ldots, p_{i,k,nom} + x\sigma_{i,k}, \ldots, p_{i,K,nom}) - E_{i,m,nom}],$$
$$i = 1, 2, \ldots, I,$$
$$m = 1, 2, \ldots, M,$$
$$k = 1, 2, \ldots, K.$$

where each of $p_{i,1}$, $p_{i,2}$, . . . , $p_{i,K}$ is a statistical process parameter for the ith FET type, $p_{i,k,nom}$ is the nominal value of the kth statistical process parameter for the ith FET type, $x\sigma_{i,k}$ indicates the shift amount for the kth statistical process parameter of the ith FET type during a particular corner simulation, and $E_{i,m,nom}$ is the nominal value of the mth electrical parameter of the ith FET type, $E_{i,m,nom} = E_{i,m}(p_{i,1,nom}, p_{i,2,nom}, \ldots, p_{i,K,nom})$, i=1, 2, . . . , I, m=1, 2, . . . , M.

Next, variance values can be determined for each one m of the M electrical parameter types for each one i of the I FET types (i.e., for each different combination of a specific electrical parameter type m and a specific FET type i) using the sensitivity values ($s_{i,m,k}$) determined by solving equation (1), the corresponding standard deviations of each of the K statistical process parameter types for each of I FET types ($\sigma_{i,k}$) and a technique of sum of squares of each individual change $s_{i,m,k}\sigma_{i,k}$. That is, I·M variance values can be calculated by using the following expressions:

$$\sum\nolimits_{i,m}^{2} \equiv \langle(\delta E_{i,m})^2\rangle = \sum_{k=1}^{K} s_{i,m,k}^2 \sigma_{i,k}^2, \quad (2)$$
$$i = 1, 2, \ldots, I,$$
$$m = 1, 2, \ldots, M.$$

Additionally, if the first number (I) is greater than one, process correlation coefficient values $r_{i,j,k}(=r_{j,i,k})$ among pairs (i, j) of the I field effect transistors for each one k of the K statistical process parameter types can be determined. Such process correlation coefficient values can be determined, for example, based on information/knowledge from the wafer processing steps of the semiconductor technology. It should be noted that $r_{i,i,k}=1$ always and, thus, there is no need to determine such process correlation coefficient values when there is only one FET type (i.e., when I=1).

Then, at least one covariance value $C_{i,m;j,n}$ associated with two different electrical parameter type-FET type combinations can, through the following expression, be determined using the sensitivity values determined by solving equation (1), the corresponding standard deviations ($\sigma_{i,k}$), and the process correlation coefficient values, if any, determined by solving equation (2):

$$C_{i,m;j,n} = C_{j,n;i,m} = \sum_{k=1}^{K} s_{i,m,k} s_{j,n,k} \sigma_{i,k} \sigma_{j,k} r_{i,j,k}, \quad (3)$$
$$i, j = 1, 2, \ldots, I,$$
$$m, n = 1, 2, \ldots, M,$$

where m and n refers to electrical parameter types, where i and j refer to FET types. Those skilled in the art will recognize that the covariance values are measures of how much two variables change together. In this case, $C_{i,m;j,n}$ refers to the covariance between an electrical parameter m in a FET type i and an electrical parameter n in a FET type j and such a covariance value is determined for each possible combination of a specific electrical parameter type and specific FET type.

Finally, an electrical correlation coefficient between the mth electrical parameter type of the ith FET type and the nth electrical parameter type of the jth FET type can be determined by solving the following expression using the previously variance values determined by solving equation (2) and covariance value(s) determined by solving equation (3):

$$c_{i,m;j,n} = c_{j,n;i,m} = \frac{C_{i,m;j,n}}{\sqrt{\Sigma_{i,m} \Sigma_{j,n}}}, \quad (4)$$
$$i, j = 1, 2, \ldots, I,$$
$$m, n = 1, 2, \ldots, M.$$

It should be noted that oftentimes designers are interested in the electrical correlation coefficients of a same type of electrical parameter among different FET types. In this case, the expression for determining the electrical correlation coefficient(s) among each pair of different FET types in the I FET types for the same electrical parameter type can be simplified as follows:

$$c_{i,m;j,m} = c_{j,m;i,m} = \frac{1}{\sqrt{\Sigma_{i,m} \Sigma_{j,m}}} \sum_{k=1}^{K} s_{i,m,k} s_{j,m,k} \sigma_{i,k} \sigma_{j,k} r_{i,j,k}, \quad (5)$$
$$i, j = 1, 2, \ldots, I,$$
$$i \neq j.$$

The number of distinctive correlation coefficient(s) will be I(I−1)/2 among I different FET types for one electrical parameter.

It should also be noted that oftentimes designers are interested in the electrical correlation coefficients among different electrical parameter types of a same FET type. The expression for determining the electrical correlation coefficients among each pair of different electrical parameter types of the M electrical parameter types for the same FET type can be simplified as follows because $r_{i,j,k}=1$:

$$c_{i,m;i,n} = c_{i,n;i,m} = \frac{1}{\sqrt{\Sigma_{i,m} \Sigma_{i,n}}} \sum_{k=1}^{K} s_{i,m,k} s_{i,n,k} \sigma_{i,k}^2, \quad (6)$$
$$m, n = 1, 2, \ldots, M,$$
$$m \neq n.$$

The number of distinctive correlation coefficient(s) will be M(M−1)/2 among M different electrical parameter types for the same FET type.

As an explicit example, consider a case where the inputs 111 indicate: two specific types of field effect transistors at issue, namely an NFET and a PFET, such that the first number (I) of FET types is equal to two; one electrical parameter type at issue, namely saturation threshold voltage ($V_{tsat}$), such that the second number (M) is equal to one; and three statistical process parameter types at issue, namely gate work function (Phig), spacer width (SpacerW), and channel length (ChannelL), such that the third number (K) is equal to three. Electrical correlation coefficients among the different FET types (i.e., NFET and PFET) for the same electrical parameter type (i.e., $V_{tsat}$) can be determined by the system 100, as follows.

The processor 130 (or, if applicable, the process parameter values calculator 130(d)) can determine the following: (a) corresponding nominal process parameter values for each of K (=3) statistical process parameter type for each of the I (=2) FET types based on the definition of the given semiconductor technology at issue and (b) corresponding standard deviations ($\sigma_{i,k}$) for each of the K (=3) statistical process parameter types for each of the I (=2) FET types based on semiconductor process/manufacturing capability.

The processor 130 (or, if applicable, the simulator 130(a)) can perform an initial simulation run (e.g., an initial technology computer-aided design (TCAD) simulation run). As shown in the table of FIG. 2, an initial TCAD simulation run (i.e., run 1) can be performed at the corresponding nominal process parameter values (also referred to herein as the nominal process points) for each of K (=3) statistical process parameter types (i.e., gate work function, spacer width and channel length) for each of the I (=2) FET types (i.e., PFET and NFET). This initial simulation run can be performed in order to obtain corresponding nominal electrical parameter values ($E_{i,m,nom}$) for $V_{tsat}$ for each of the I (=2) FET types.

Then, given the corresponding nominal process parameter values and the corresponding standard deviations ($\sigma_{i,k}$) for each of the K (=3) statistical process parameter types for each of the I (=2) FET types, the processor 130 (or, if applicable, the simulator 130(c)) can further perform I·M·K additional TCAD simulation runs, where I=2, M=1 and K=3 such that the number of additional TCAD simulation runs performed is six. The initial simulation run can be referred to as run 1 and, in this case, the additional simulation runs can be referred to as runs 2-7. Each additional simulation run can be performed so as to shift only a single selected one of the K (=3) statistical process parameter types for a selected one of the I (=2) FET types to a corner process parameter value with all others set at their corresponding nominal process parameter values. For example, as illustrated in the table of FIG. 2, during each successive additional simulation run 2-7 only one specific statistical process parameter for one specific type of FET is shifted from its nominal process parameter value to a corner process parameter value. Specifically, during run 2 (i.e., the first additional simulation run after the initial simulation run), the gate work function (Phig) of the NFET can be set at its corner value and the gate work function (Phig) of the PFET, the spacer widths of the NFET and PFET and the channel lengths of the NFET and PFET can be set at their respective nominal values. During run 3, the gate work function (Phig) of the PFET can be set at its corner value and the gate work function (Phig) of the NFET, the spacer widths of the NFET and PFET and the channel lengths of the NFET and PFET can be set at their respective nominal values. During run 4, the spacer width of the NFET can be set at its corner value and the spacer width of the PFET, the gate work functions of the NFET and PFET and the channel lengths of the NFET and PFET can be set at their respective nominal values. During run 5, the spacer width of the PFET can be set at its corner value and the spacer width of the NFET, the gate work functions of the NFET and PFET and the channel lengths of the NFET and PFET can be set at their respective nominal values. During run 6, the channel length of the NFET can be set at its corner value and the channel length of the PFET, the gate work functions of the NFET and PFET and the spacer widths of the NFET and PFET can be set at their respective nominal values. During run 7, the channel length of the PFET can be set at its corner value and the channel length of the NFET, the gate work functions of the NFET and PFET and the spacer widths of the NFET and PFET can be set at their respective nominal values. These additional simulation runs (i.e., runs 2-7) can be performed in order to obtain corner electrical parameter values ($E_{i,m}$) for $V_{tsat}$ for each of the I (=2) FET types with respect to a change in each of K (=3) statistical process parameter types.

The processor 130 (or, if applicable, the correlation coefficients calculator 130(b)) can then use the results of the initial simulation run, including the corresponding nominal saturation threshold voltage ($V_{tsat}$) values ($V_{tsat,i,nom} = V_{tsat,i}(p_{i,Phig,nom}, p_{i,SpacerW,nom}, p_{i,ChannelL,nom})$, the results of the additional simulation runs, including the corresponding corner saturation threshold voltage ($V_{tsat}$) values, and the corresponding standard deviations to determine electrical correlation coefficients among the two FET types (i.e., among the NFET and the PFET) for the saturation threshold voltage ($V_{tsat}$).

Specifically, the nominal $V_{tsat}$ values acquired during the initial simulation run (i.e., run 1) and the corner $V_{tsat}$ values acquired during the additional simulation runs (i.e., runs 2-7) can be used to determine three sensitivity values ($s_{i,k}$) with respect to each of the K (=3) statistical process parameter types (e.g., with respect to the gate work function ($p_{Phig}$), with respect to the spacer width ($p_{SpacerW}$), and with respect to the channel length ($p_{channelL}$)) for each pair of FET types in the I (=2) FET types using the following expressions, which are based on equation (1) above:

$$s_{i,Phig} = \frac{1}{x\sigma_{i,Phig}}[V_{tsat,i}(p_{i,Phig,nom} + x\sigma_{i,Phig}, p_{i,SpacerW,nom}, p_{i,ChannelL,nom}) - V_{tsat,i,nom}], \quad (7)$$

$$s_{i,SpacerW} = \frac{1}{x\sigma_{i,SpacerW}}[V_{tsat,i}(p_{i,Phig,nom}, p_{i,SpacerW,nom} + x\sigma_{i,SpacerW}, p_{i,ChannelL,nom}) - V_{tsat,i,nom}],$$

$$s_{i,ChannelL} = \frac{1}{x\sigma_{i,ChannelL}}[V_{tsat,i}(p_{i,Phig,nom}, p_{i,SpacerW,nom}, p_{i,ChannelL,nom} + x\sigma_{i,ChannelL}) - V_{tsat,i,nom}],$$

$$i = nfet, pfet,$$

where i refers to one of the two FET types, k refers to one of the three statistical process parameter types, $p_{i,Phig,nom}$, $p_{i,SpacerW,nom}$, $p_{i,ChannelL,nom}$ are nominal values of statistical process parameters, and x can be one of 1, 2, 3, −1, −2, −3, etc.

Next, variance values can be determined for each of the two FET types and the saturation threshold voltage ($V_{tsat}$) using the previously determined sensitivity values ($s_{i,k}$), the standard deviations of each of the three statistical process parameter types for each of the two FET types ($\sigma_{i,k}$) and a technique of a sum of the squares of the product of $s_{i,k}$ and $\sigma_{i,k}$. That is, two variance values (i.e., I·M or 2×1) can be determined by using the following expression, which is based on equation (2) above:

$$\sum\nolimits_{i}^{2} \equiv \langle (\delta V_{tsat,i})^2 \rangle = \sum_{k=1}^{K} s_{i,k}^2 \sigma_{i,k}^2, \qquad (8)$$

$$i = nfet, pfet.$$

Figure 3A:
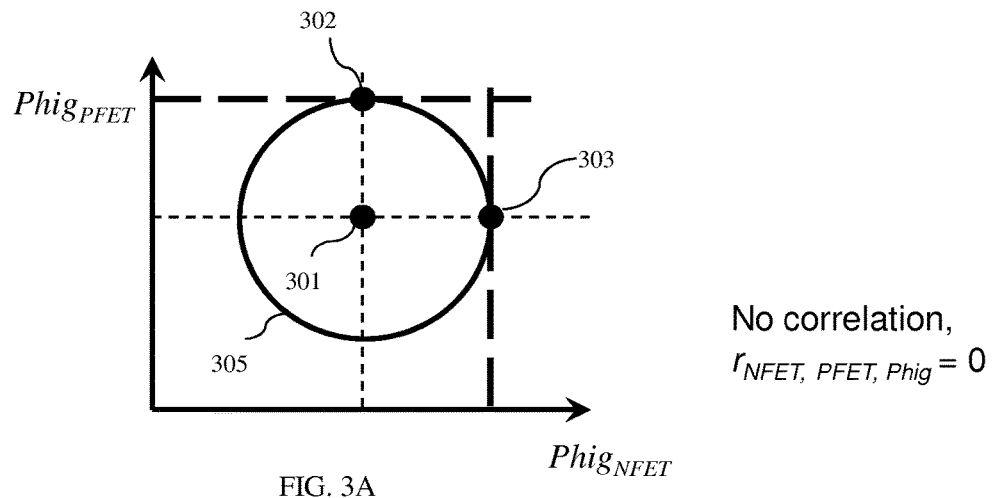
FIG. 3A shows an exemplary scattering plot outline of gate work function for an NFET and a PFET.
Figure 3B:
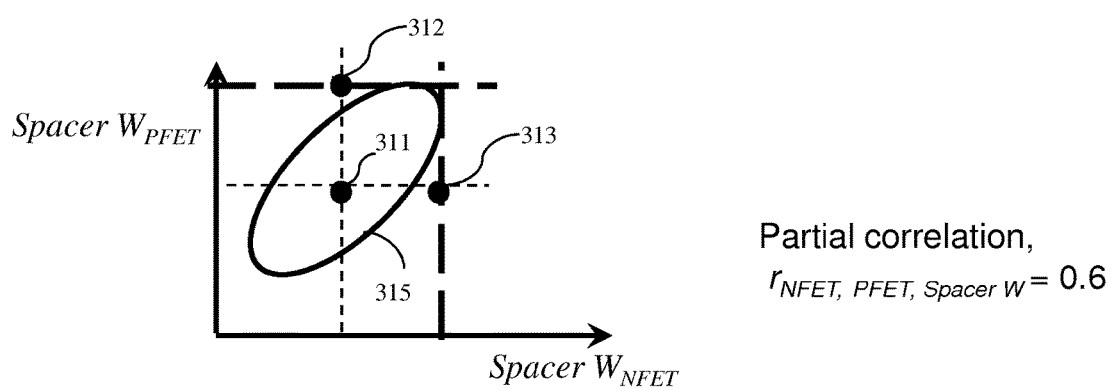
FIG. 3B shows an exemplary scattering plot outline of spacer width for an NFET and a PFET.
Figure 3C:
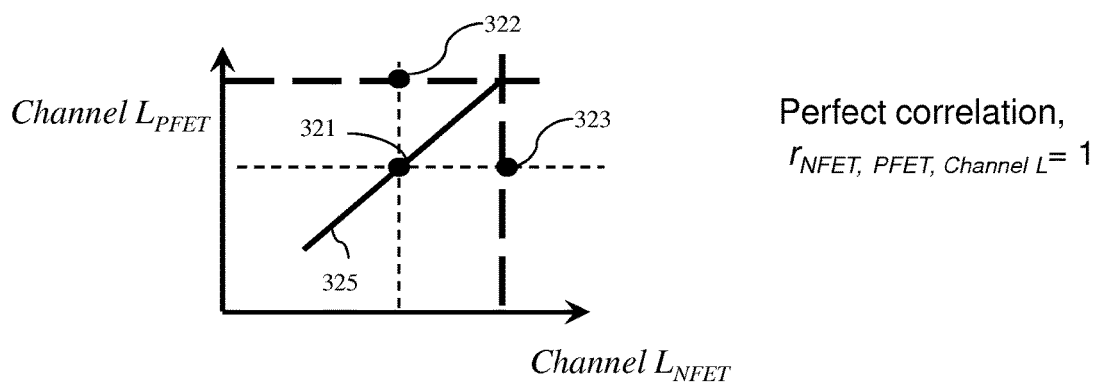
FIG. 3C shows an exemplary scattering plot outline of channel length for an NFET and a PFET.

Additionally, since the number of FET types is greater than one (i.e., since I>1), then for each one k of the three statistical process parameters, a process correlation coefficient value $r_{i,j,k}$ ($=r_{j,i,k}$) between the two FET types can be identified, where i refers to one of the two FET types and j refers to the other FET type. For example, each of FIGS. 3A-3C shows an outline of the scattering plot between a statistical process parameter of the NFET and the PFET. Those skilled in the art will recognize that with such a scattering plot the shape of the outline of the plotted points illustrates the relationships between the statistical process parameter for the NFET and that same statistical process parameter for the PFET. FIG. 3A is for the gate work functions of the NFET and PFET, FIG. 3B is for the spacer widths of the NFET and PFET, and FIG. 3C is for the channel lengths of the NFET and PFET. Specifically, in FIG. 3A, item 301 represents the intersection of the nominal gate work functions values for the NFET and PFET, item 302 represents the corner value for the gate work function of the PFET ($x\sigma_{PFET, Phig}$), item 303 represents the corner value for the gate work function of the NFET ($x\sigma_{NFET, Phig}$) and the circle shape of item 305 that there is no correlation between the value of the gate work function of the NFET and the value of the gate work function of the PFET. In this case, the process correlation coefficient between the gate work functions of the NFET and the PFET is determined to be zero (i.e., $r_{NFET, PFET, Phig}=0$). In FIG. 3B, item 311 represents the intersection of the nominal spacer width values for the NFET and PFET, item 312 represents the corner value for the spacer width of the PFET ($x\sigma_{PFET, SpacerW}$), item 313 represents the corner value for the spacer width of the NFET ($x\sigma_{NFET, SpacerW}$) and the elliptical shape of item 315 indicates that there is a partial correlation between the value of the spacer width of the NFET and the value of the spacer width of the PFET. In this case, the process correlation coefficient among the spacer widths of the PFET and the NFET is determined to be between 0 and 1 (e.g., $r_{NFET,PFET,SpacerW}=0.6$). In FIG. 3C, item 321 represents intersection of the nominal channel length values for the NFET and PFET, item 322 represents the corner value for the channel lengths of the PFET ($x\sigma_{PFET, ChannelL}$), item 323 represents the corner value for the channel length of the NFET ($x\sigma_{NFET, ChannelL}$) and the shape (a line segment with an angle of 45 degrees) indicates that there is a perfect correlation between the value of the channel length of the NFET and the value of the channel length of the PFET. In this case, the process correlation coefficient among the channel lengths of the NFET and the PFET is determined to be one (i.e., $r_{NFET,PFET,ChannelL}=1$). The additional simulation runs (i.e., runs 2-7) will be performed to determine corner electrical parameter values for each of the M electrical parameter types for each of the I (=2) FET types (i.e., for each different combination of a specific electrical parameter type m and a specific FET type i).

A covariance value between the saturation threshold voltage ($V_{tsat}$) in the NFET and the saturation threshold voltage ($V_{tsat}$) in the PFET ($C_{NFET,Vtsat,PFET,Vtsat}$) can then be determined using the previously determined variance values and the previously identified process correlation coefficients (i.e., $r_{NFET, PFET, Phig}$, $r_{NFET,PFET,SpacerW}$, and $r_{NFET, PFET, ChannelL}$) through the following expression, which is a simplification of the equation (3) above:

$$C_{NFET,Vtsat,PFET,Vtsat} = \qquad (9)$$
$$\sum_{k=1}^{3} s_{NFET,Vtsat,k} s_{PFET,Vtsat,k} \sigma_{NEFT,k} \sigma_{PFET,k} r_{NFET,PFET,k}.$$

It should be noted that since $r_{NFET, NFET, Phig}$ is equal to zero, $\sigma_{NFET, Phig}$ and $\sigma_{PFET, Phig}$ do not contribute to the covariance. Thus, equation (9) can further be simplified as follows:

$$C_{NFET,Vtsat,PFET,Vtsat} = 0.6 s_{NFET,Vtsat,SpacerW}$$
$$s_{PFET,Vtsat,SpacerW} \sigma_{NFET,SpacerW} \sigma_{PFET,SpacerW} +$$
$$s_{NFET,Vtsat,ChannelL} s_{PFET,Vtsat,ChannelL}$$
$$\sigma_{NFET,ChannelL} \sigma_{PFET,ChannelL}. \qquad (10)$$

Next, an electrical correlation coefficient between the I (=2) FET types for the saturation threshold voltage ($V_{tsat}$) can be determined by solving the following expression, which is based on equation (4) above and incorporates the previously determined variance and covariance values:

$$c(NFET, Vtsat, PFET, Vtsat) = \frac{C_{NFET,Vtsat;PFET,Vtsat}}{\sqrt{\Sigma_{NEFT,Vtsat} \Sigma_{PFET,Vtsat}}}. \qquad (11)$$

In any case, once the electrical correlation coefficient(s) among each pair of different FET types in the first number (I) of FET types for the same electrical parameter type and/or among each pair of different electrical parameter types in the second number (M) of electrical parameter types for the same FET type is/are determined, the processor 130 (or, if applicable, the compact model generator 130(c)) can use the acquired electrical correlation coefficient(s) to develop a compact model for a semiconductor process technology. This compact model can then be used to perform variation-aware design of an integrated circuit chip.

Figure 4:
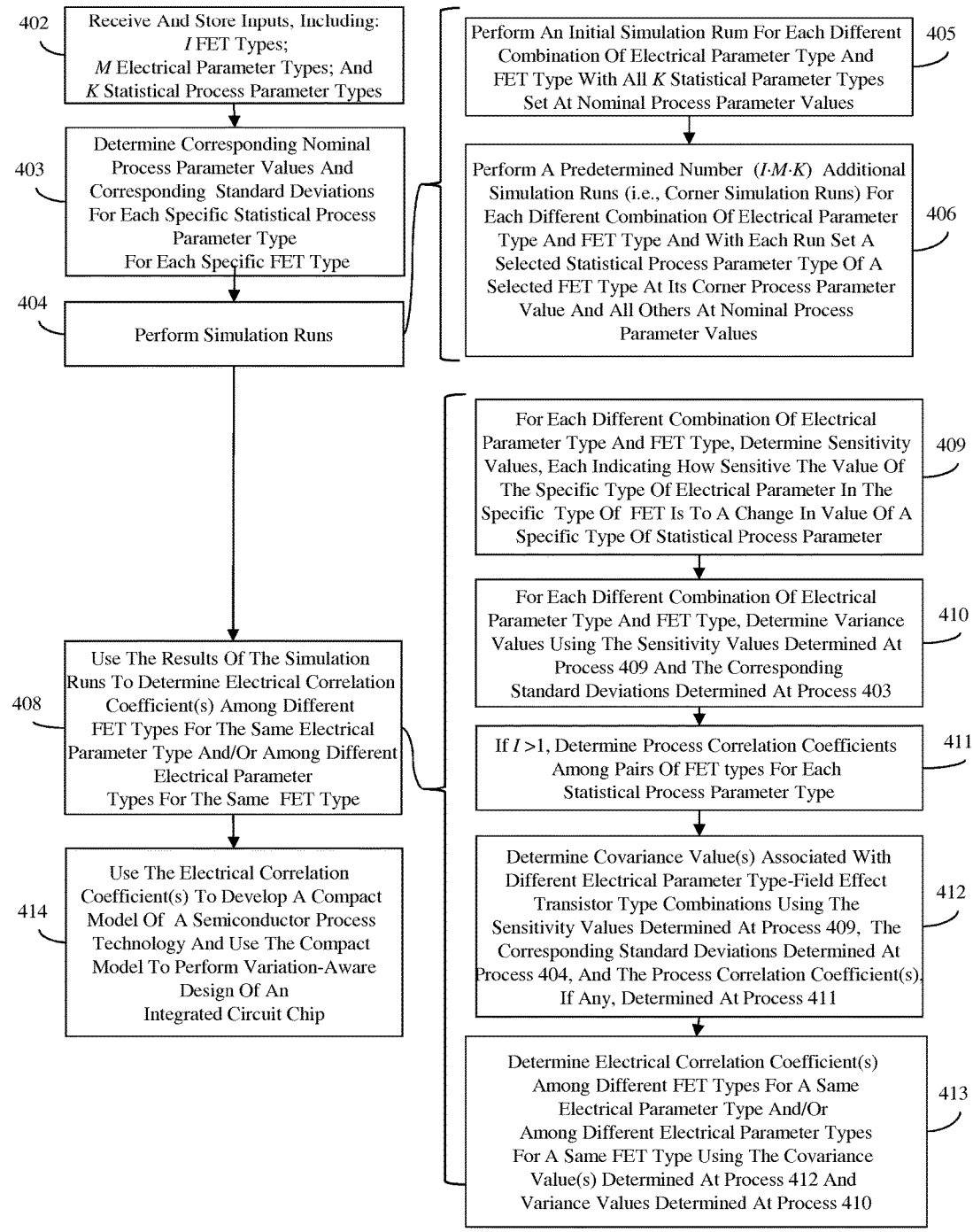
FIG. 4 is a flow diagram illustrating a method for determining at least one correlation coefficient among different field effect transistor (FET) types for a same electrical parameter type and/or among different electrical parameter types for a same FET type; and, FIG. 5 is a schematic diagram illustrating a representative hardware environment for practicing the system of FIG. 1 and the method of FIG. 4.

Referring to the flow diagram of FIG. 4 in combination with FIG. 1, also disclosed herein is a computer-implemented method for determining at least one correlation coefficient among different field effect transistor (FET) types for a same electrical parameter type and/or among different electrical parameter types for a same FET type. As mentioned above, correlation coefficients among different FET types for a same electrical parameter type and correlation coefficients among different electrical parameter types for a same FET type are referred to herein as electrical correlation coefficients.

This method can comprise receiving a plurality of inputs 111 from a user (402). The inputs 111 can be received, for example, by a computer system, such as the computer system 100 of FIG. 1. The inputs 111 can, for example, be in the form of menu selections made through a graphical user interface 150 of the computer system 100 and stored a memory 110, which is accessible by at least one processor of the computer system 100.

The inputs 111 can indicate a specific FET type or multiple specific FET types to be considered and, thus, can indicate a first number (I) of FET types. That is, if one specific FET type is indicated by the inputs 111, then first number (I) is one; if two specific FET types are indicated by the inputs 111, then first number (I) is two; and so on. The type of field effect transistor can simply refer to the conductivity type of the field effect transistor (e.g., an N-type field effect transistor (NFET) or a P-type field effect transistor (PFET)). Additionally or alternatively, the type of field effect transistor can refer to some other property or characteristic that distinguishes the field effect transistors at issue (e.g., threshold voltage level type, gate dielectric thickness level type and/or any other suitable property or characteristic that distinguishes the field effect transistors at issue). For example, the type of field effect transistor can refer to both the conductivity type and the threshold voltage level type such as, a regular threshold voltage (RVT) NFET, a RVT PFET, a high threshold voltage (HVT) NFET, a HVT PFET, a mezzanine threshold voltage (MVT) NFET, a MVT PFET, a super-high threshold voltage (SHVT) NFET, a SHVT PFET, a low threshold voltage (LVT) NFET, a LVT PFET, a ultra-high threshold voltage (UHVT) NFET, a UHVT PFET, and so on. Additionally or alternatively, the type of field effect transistor can refer to gate dielectric thickness level type (e.g., EGNFET or EGPFETs with mid-oxide thickness; DGNFETs or DGPFETs with thick oxide thickness; and so on).

The inputs 111 can also indicate a specific electrical parameter type or multiple specific electrical parameter types to be considered and, thus, can indicate a second number (M) of electrical parameter types. That is, if one specific electrical parameter type is indicated by the inputs 111, then second number (M) is one; if two specific electrical parameter types are indicated by the inputs 111, then second number (M) is two; and so on. The type of electrical parameter can be any electrical property exhibited by a field effect transistor. For example, different electrical parameter types can include, but are not limited to, saturation threshold voltage ($V_{tsat}$), linear threshold voltage ($V_{tlin}$), effective drain current ($I_{d,eff}$), low drain current ($I_{d,low}$), high drain current ($I_{d,high}$), off current ($I_{off}$), gate resistance ($R_{gate}$), and overlap capacitance ($C_{ov}$).

It should be noted that for purposes of determining the electrical correlation coefficient(s) mentioned above (i.e., at least one correlation coefficient among different FET types for a same electrical parameter type and/or at least one correlation coefficient among different electrical parameter types for a same FET type) using the technique disclosed herein, the first number (I) of FET types should be greater than one and/or the second number (M) of electrical parameter types should be greater than one. Specifically, the first number (I) of field effect transistors should be greater than one to determine at least one electrical correlation coefficient among different FET types for a same electrical parameter type, the second number (M) of electrical parameter types should be greater than one to determine at least one electrical correlation coefficient among different electrical parameter types for a same FET type, and both the first number (I) of FET types and the second number (M) of electrical parameter types should be greater than one to determine electrical correlation coefficients among different FET types for different electrical parameter type.

The inputs 111 can also indicate specific statistical process parameter types to be considered and, thus, can indicate a third number (K) of statistical process parameter types. The statistical process parameter types can be process parameters that have been identified as having an impact on any one or more of the specific electrical parameter type(s). That is, variations in any one or more of these statistical process parameter types can cause variations in one or more of the electrical parameter types. The specific statistical process parameter types can, for example, include any one or more of the following: channel length, channel width (in planar FETs), semiconductor fin height (in FinFETs), semiconductor fin thickness (in FinFETs), gate dielectric thickness, gate work function, FET component doping (e.g., source/drain region doping, channel region doping, halo region doping, polysilicon gate doping, etc.), etc.

It should be noted that for purposes of this disclosure the letter i refers to a specific FET type and, if a comparison between two FET types is required for a given process step, the letter j also refers to a specific FET type. Similarly, the letter m refers to a specific electrical parameter type and, if a comparison between two electrical parameter types is required for a given process step, the letter n also refers to a specific electrical parameter type. The letter k refers to a specific statistical process parameter type.

The method can further comprise accessing the inputs and determining the following: (a) corresponding nominal process parameter values for each of the K statistical process parameter types for each of the I FET types (i.e., for each different combination of a specific statistical process parameter type k and a specific FET type i); and (b) corresponding standard deviations ($\sigma_{i,k}$) for each of the K statistical process parameter types for each of the I FET types (i.e., for each different combination of a specific statistical process parameter type k and a specific FET type i) (403). The corresponding nominal process parameters and the corresponding standard deviations for each of the K statistical process parameter types for each of the I field effect transistor types ($\sigma_{i,k}$) can stored with design information 112 in memory 110.

The method can further comprise using the inputs received at process 402 as well as the corresponding nominal process parameter values and the corresponding standard deviations ($\sigma_{i,k}$) determined at process 403 to perform simulation runs (404). The process 404 can be performed, for example, using a processor 130 or 130(a) of the computer system 100.

At process 404, an initial simulation run (e.g., an initial technology computer-aided design (TCAD) simulation run) can be performed for each FET type and each electrical parameter type indicated by the inputs 111 (i.e., for each different combination of a specific electrical parameter type m and a specific FET type i) (405). This initial simulation run can be performed with all of the K statistical process parameter types for all of the I FET types being set at their corresponding nominal process parameter values in order to determine corresponding nominal electrical parameter values $E_{i,m}$ for each m of the M electrical parameter types for each i of the I FET types (i.e., for each different combination of a specific electrical parameter type m and a specific FET type i).

Additionally, at process 404, a predetermined number of additional simulation runs (e.g., additional TCAD simulation runs) can further be performed for each electrical parameter type and each FET type (i.e., for each different combination of a specific electrical parameter type m and a specific FET type i) (406). Specifically, each additional simulation run can be a corner simulation run. Each additional simulation run can be performed with all except a selected one k of the K statistical process parameter types for a selected one i of the I FET types being set at their corresponding nominal process parameter values and with the selected one k of the K statistical process parameter types for the selected one i of the I FET types being set at its corresponding corner process parameter value. Each subsequent additional simulation run will be performed in the exact same manner except that the selected statistical process parameter type-FET type combination for which a corner process parameter value is used is shifted. That is, during each subsequent additional simulation run, a different statistical process parameter type for the same FET type or the same statistical process parameter type for a different FET type will be set at its corresponding corner process parameter value, while all others are set at their corresponding nominal process parameter values. Such additional simulation runs are performed until all I·K possible combinations are considered. For each of such I·K combinations, M simulation runs are performed and each simulation determines a corner value of one electrical parameter as a result of a change in one statistical process parameter. Thus, the number of additional simulation runs will be a predetermined number of additional simulation runs equal to the product of the first number (I), the second number (M) and the third number (K) and these additional simulation runs will be performed to determine corner electrical parameter values for each of the M electrical parameter types for each of the I FET types with respect to each of the K statistical process parameter types.

It should be noted that, in each additional simulation run, the corner process parameter value used for the selected statistical-process-parameter type-FET-type combination should be a set multiple x (e.g., x being 1, 2, 3, −1, −2, or −3) of the corresponding standard deviation (i.e., $x\sigma_{i,k}$) from the corresponding nominal process parameter value of that specific statistical process parameter of that specific FET type. This multiple x can be the same for all runs.

The results of the initial simulation run (i.e., the nominal electrical parameter value(s) for each different combination of a specific electrical parameter type m and a specific FET type i), the results of the additional I·M·K simulation runs (i.e., the corner electrical parameter values for each different combination of a specific electrical parameter type m and a specific FET type i), and the corresponding standard deviations ($\sigma_{i,k}$) can subsequently be used, e.g., by a processor 130 or 130(b) of the computer system 100, to determine the electrical correlation coefficient(s) among each pair of different FET types in the I FET types for a specific electrical parameter type (e.g., when I is greater than one) and/or among each pair of different electrical parameter types in the M electrical parameter types for a specific FET type (e.g., when M is greater than one) (408).

In order to determine the electrical correlation coefficient(s) at process 408, the following process steps can be performed.

For each one m of the M electrical parameter types for each one i of the I FET types (i.e., for each different combination of a specific electrical parameter type m and a specific FET type i), the corresponding nominal electrical parameter values $E_{i,m}$ acquired during the initial simulation run and the corresponding corner electrical parameter values $E_{i,m}$ acquired during the additional simulation runs can be used to solve equation (1), discussed in detail above, for determining sensitivity values ($s_{i,m,k}$) with respect to each of the third number (K) statistical process parameter types, where each sensitivity value ($s_{i,m,k}$) indicates how sensitive the value of the mth electrical parameter of the ith type of field effect transistor is with respect to a change in the value of the kth statistical process parameter k (409).

Then, variance values can be determined for each one m of the M electrical parameter types for each one i of the I FET types (i.e., for each different combination of a specific electrical parameter type m and a specific FET type i) using the sensitivity values ($s_{i,m,k}$) determined at process 409, the standard deviations of each of the K statistical process parameter types for each of the I FET types ($\sigma_{i,k}$) determined at process 403 and a technique of sum of squares of each individual change $s_{i,m,k}\sigma_{i,k}$ (410). That is, I*M variance values can be calculated at process 410 by solving the equation (2), discussed in detail above.

Additionally, if the first number (I) is greater than one, process correlation coefficient values $r_{i,j,k}(=r_{j,i,k})$ among pairs (i, j) of the I field effect transistors for each one k of the K statistical process parameter types can be determined, as discussed above with regard to the system 100 (411). Such process correlation coefficients can be determined, for example, based on information/knowledge from the wafer processing steps of the semiconductor technology. It should be noted that $r_{i,i,k}=1$ always and, thus, there is no need to determine such process correlation coefficients when there is only one FET type (i.e., when I=1).

Next, at least one covariance value $C_{i,m;j,n}$ associated with different electrical parameter type-FET type combinations can be determined by solving equation (3), discussed in detail above, using the sensitivity values determined at process 409, the corresponding standard deviations ($\sigma_{i,k}$) determined at process 403, and the process correlation coefficient(s), if any, determined at process 411 (412).

Finally, at least one electrical correlation coefficient among the I FET types for the same electrical parameter type and/or at least one electrical correlation coefficient among the M electrical parameter types for the same FET type can be determined, discussed in detail above, using covariance value(s) determined at process 412 (413). For example, an electrical correlation coefficient between the mth electrical parameter type of the ith FET type and the nth electrical parameter type of the jth FET type can be determined by solving equation (4) using the variance values determined at process 410 and the covariance value(s) determined at process 412. It should be noted that oftentimes designers are interested in the electrical correlation coefficients of a same type of electrical parameter among different FET types. In this case, the expression for determining the electrical correlation coefficient(s) among each pair of different FET types in the I FET types for the same electrical parameter type can be simplified, as set forth in expression (5) (see detailed discussion above) and the number of distinctive correlation coefficient(s) will be I(I−1)/2 among I different FET types for one electrical parameter. Also, oftentimes designers are interested in the electrical correlation coefficients among different electrical parameter types of a same FET type. In this case, because $r_{i,j,k}=1$, the expression for determining the electrical correlation coefficients among each pair of different electrical parameter types of the M electrical parameter types for the same FET type can be simplified as set forth in expression (6) (see detailed discussion above) and the number of distinctive correlation coefficient(s) will be M(M−1)/2 among M different electrical parameter types for the same FET type.

Once the electrical correlation coefficient(s) among each pair of different FET types in the first number (I) of FET types for the same electrical parameter type and/or at least one electrical correlation coefficient(s) among each pair of different electrical parameter types in the second number (M) electrical parameter types for the same FET type are determined, the method can comprise subsequently using (e.g., by a processor 130 or 130(c) of the computer system 100) the acquired electrical correlation coefficient(s) to develop a compact model for a semiconductor process technology (414). This compact model can then be used to perform variation-aware design of an integrated circuit chip.

Also disclosed herein is a computer program product. This computer program product can comprise a computer readable storage medium having program code embodied therewith. The program code can be executable by a processor of a computer system to perform the above-described method for determining at least one correlation coefficient among different field effect transistor (FET) types for a same electrical parameter type and/or among different electrical parameter types for a same FET type. More particularly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
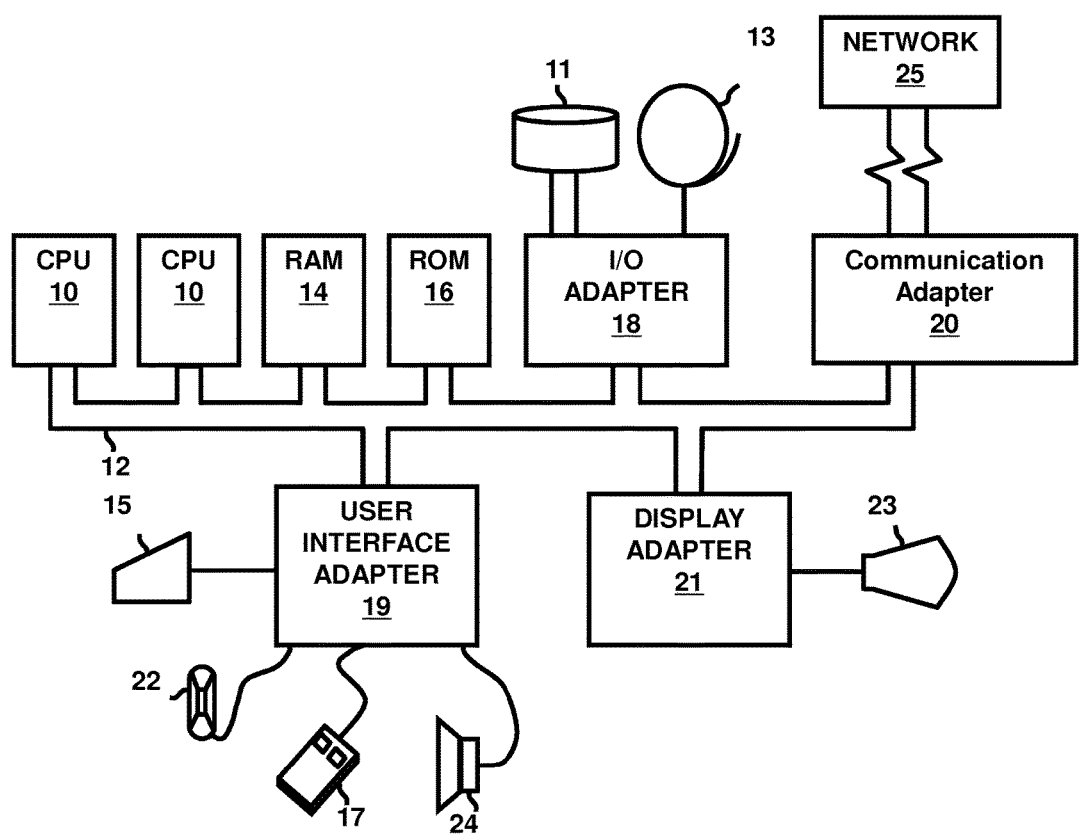

A representative hardware environment for practicing the method, system and program storage device embodiments of the invention is depicted in FIG. 5. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should further be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are a system, method and computer program product for determining correlation coefficient(s) among different field effect transistor (FET) types for a same electrical parameter type and/or among different electrical parameter types for a same FET type. In the embodiments, the correlation coefficient(s) are determined based on the results of a limited number of simulation runs. Specifically, the number of simulation runs required by the disclosed embodiments is limited to one plus the product of the number of different FET types at issue, the number of different electrical parameter types at issue and the number of statistical process parameter types that impact the different electrical parameter types. Such correlation coefficient(s) can subsequently be used to develop a compact model of a semiconductor process technology. This compact model can then be used to perform variation-aware design of an integrated circuit chip. Since the disclosed technique requires only a limited number of simulation runs to determine the correlation coefficient(s), it is much more efficient in terms of time and costs than techniques which require Monte Carlo simulation runs to be performed and/or that require hardware measurements to be acquired.

What is claimed is:

1. A system comprising:
a user interface receiving inputs indicating a first number of field effect transistor types, a second number of electrical parameter types and a third number of statistical process parameter types, wherein at least one of said first number and said second number is greater than one;
a memory in communication with said user interface and storing said inputs; and,
a processor in communication with said memory,
said processor performing an initial simulation run for each field effect transistor type and each electrical parameter type indicated by said inputs, performing a predetermined number of additional simulation runs for said each field effect transistor type and said each electrical parameter type, and using results of said initial simulation run and said additional simulation runs to determine at least one electrical correlation coefficient among at least one of the following:
among each pair of different field effect transistor types in said first number of field effect transistor types for a specific electrical parameter type, when said first number is greater than one; and
among each pair of different electrical parameter types in said second number of electrical parameter types for a specific field effect transistor type, when said second number is greater than one, said predetermined number of additional simulation runs being equal to a product of said first number, said second number and said third number, and
said processor using said at least one electrical correlation coefficient to develop a compact model for a semiconductor process technology and using said compact model to perform variation-aware design of an integrated circuit chip.

2. The system of claim 1, said processor determining corresponding nominal process parameter values and corresponding standard deviations for each of said third number of said statistical process parameter types for each of said first number of said field effect transistor types prior to said performing of said initial simulation run and said additional simulation runs,
said initial simulation run being performed with all of said third number of said statistical process parameter types for all of said first number of said field effect transistor types being set at said corresponding nominal process parameter values in order to determine corresponding nominal electrical parameter values for each of said second number of said electrical parameter types for each of said first number of said field effect transistor types,
each additional simulation run being a corner simulation run performed with all except a selected one of said third number of said statistical process parameter types for a selected one of said first number of said field effect transistor types being set at said corresponding nominal process parameter values and with said selected one of said third number of said statistical process parameter types for said selected one of said first number of said field effect transistor types being set at a corresponding corner process parameter value, said corresponding corner process parameter value being a given multiple of a corresponding standard deviation associated with said selected one of said third number of statistical parameter types for said selected one of said first number of field effect transistor types, and said additional simulation runs being performed to determine corner electrical parameter values for said each of said second number of said electrical parameter types for said each of said first number of said field effect transistor types.

3. The system of claim 2, said processor performing the following in order to determine said at least one electrical correlation coefficient:

for said each of said second number of said electrical parameter types for said each of said first number of said field effect transistor types, using said corresponding nominal electrical parameter values and said corner electrical parameter values to determine sensitivity values with respect to each of said third number of said statistical process parameter types;

determining variance values using said sensitivity values and said corresponding standard deviations of each of said third number of said statistical process parameter types for each of said first number of field effect transistor types;

when said first number is greater than one, determining process correlation coefficient values among said statistical process parameter types;

determining at least one covariance value using said sensitivity values, said corresponding standard deviations of each of said third number of said statistical process parameter types for each of said first number of field effect transistor types, and said process correlation coefficient values; and, determining said at least one electrical correlation coefficient using said at least one covariance value.

4. The system of claim 1, said initial simulation run and said additional simulation runs comprising technology computer-aided design (TCAD) simulation runs.

5. The system of claim 1, said field effect transistor types comprising at least two different field effect transistor types when said first number is greater than one, said at least two different field effect transistor types having at least one of different conductivity types and different threshold voltage levels.

6. The system of claim 1, said electrical parameter types comprising at least two of saturation threshold voltage, linear threshold voltage, effective drain current, low drain current, high drain current, off current, gate resistance, and overlap capacitance when said second number is greater than one.

7. The system of claim 1, said statistical process parameter types comprising any of channel length, channel width, gate dielectric thickness, gate work function and doping.

8. The system of claim 1, wherein said using of said at least one electrical correlation coefficient, which was developed using said initial simulation run and said predetermined number of additional simulation runs, to develop said compact model improves system efficiency by eliminating requirements for Monte Carlo simulation runs or hardware measurements.

9. A method comprising:

receiving inputs indicating a first number of field effect transistor types, a second number of electrical parameter types and a third number of statistical process parameter types, wherein at least one of said first number and said second number is greater than one and wherein said inputs are received through a user interface of a computer system and stored in a memory accessible by a processor of said computer system;

performing, by said processor, an initial simulation run for each field effect transistor type and each electrical parameter type indicated by said inputs and a predetermined number of additional simulation runs for said each field effect transistor type and said each electrical parameter type;

using, by said processor, results of said initial simulation run and said additional simulation runs to determine at least one electrical correlation coefficient among at least one of the following:

among each pair of different field effect transistor types in said first number of field effect transistor types for a specific electrical parameter type, when said first number is greater than one; and among each pair of different electrical parameter types in said second number of electrical parameter types for a specific field effect transistor type, when said second number is greater than one, said predetermined number of additional simulation runs being equal to a product of said first number, said second number and said third number; and using, by said processor, said at least one electrical correlation coefficient to develop a compact model for a semiconductor process technology and using said compact model to perform variation-aware design of an integrated circuit chip.

10. The method of claim 9, further comprising determining corresponding nominal process parameter values and corresponding standard deviations for each of said third number of said statistical process parameter types for each of said first number of said field effect transistor types prior to said performing of said initial simulation run and said additional simulation runs, said initial simulation run being performed with all of said third number of said statistical process parameter types for all of said first number of said field effect transistor types being set at said corresponding nominal process parameter values in order to determine corresponding nominal electrical parameter values for each of said second number of said electrical parameter types for each of said first number of said field effect transistor types, each additional simulation run being a corner simulation run performed with all except a selected one of said third number of said statistical process parameter types for a selected one of said first number of said field effect transistor types being set at said corresponding nominal process parameter values and with said selected one of said third number of said statistical process parameter types for said selected one of said first number of said field effect transistor types being set at a corresponding corner process parameter value, said corresponding corner process parameter value being a given multiple of a corresponding standard deviation associated with said selected one of said third number of statistical parameter types for said selected one of said first number of field effect transistor types, and said additional simulation runs being performed to determine corner electrical parameter values for said each of said second number of said electrical parameter types for said each of said first number of said field effect transistor types.

11. The method of claim 10, said at least one electrical correlation coefficient being determined by performing the following:
for said each of said second number of said electrical parameter types for said each of said first number of said field effect transistor types, using said corresponding nominal electrical parameter values and said corner electrical parameter values to determine sensitivity values with respect to each of said third number of said statistical process parameter types;
determining variance values using said sensitivity values and said corresponding standard deviations of each of said third number of said statistical process parameter types for each of said first number of field effect transistor types;
when said first number is greater than one, determining process correlation coefficient values among said statistical process parameter types;
determining at least one covariance value using said sensitivity values, said corresponding standard deviations of each of said third number of said statistical process parameter types for each of said first number of field effect transistor types, and said process correlation coefficient values; and,
determining said at least one electrical correlation coefficient using said at least one covariance value.

12. The method of claim 9, said initial simulation run and said additional simulation runs comprising technology computer-aided design (TCAD) simulation runs.

13. The method of claim 9, said field effect transistor types comprising at least two different field effect transistor types when said first number is greater than one, said at least two different field effect transistor types having at least one of different conductivity types and different threshold voltage levels.

14. The method of claim 9, said electrical parameter types comprising at least two of saturation threshold voltage, linear threshold voltage, effective drain current, low drain current, high drain current, off current, gate resistance, and overlap capacitance when said second number is greater than one.

15. The method of claim 9, said statistical process parameter types comprising any of channel length, channel width, gate dielectric thickness, gate work function and doping.

16. The method of claim 9, wherein said using of said at least one electrical correlation coefficient, which was developed using said initial simulation run and said predetermined number of additional simulation runs, to develop said compact model improves system efficiency by eliminating requirements for Monte Carlo simulation runs or hardware measurements.

17. A computer program product comprising a computer readable storage medium having program code embodied therewith, said program code being executable by a processor to perform a method, said method comprising:
receiving inputs indicating a first number of field effect transistor types, a second number of electrical parameter types and a third number of statistical process parameter types, wherein at least one of said first number and said second number is greater than one; and
performing an initial simulation run for each field effect transistor type and each electrical parameter type and a predetermined number of additional simulation runs for said each field effect transistor type and said each electrical parameter type; and,
using results of said initial simulation run and said additional simulation runs to determine at least one electrical correlation coefficient among at least one of the following:
among each pair of different field effect transistor types in said first number of field effect transistor types for a specific electrical parameter type, when said first number is greater than one; and
among each pair of different electrical parameter types in said second number of electrical parameter types for a specific field effect transistor type, when said second number is greater than one, said predetermined number of additional simulation runs being equal to a product of said first number, said second number and said third number; and
using said at least one electrical correlation coefficient to develop a compact model for a semiconductor process technology and using said compact model to perform variation-aware design of an integrated circuit chip.

18. The computer program product of claim 17, said method further comprising determining corresponding nominal process parameter values and corresponding standard deviations for each of said third number of said statistical process parameter types for each of said first number of said field effect transistor types prior to said performing of said initial simulation run and said additional simulation runs,
said initial simulation run being performed with all of said third number of said statistical process parameter types for all of said first number of said field effect transistor types being set at said corresponding nominal process parameter values in order to determine corresponding nominal electrical parameter values for each of said second number of said electrical parameter types for each of said first number of said field effect transistor types,
each additional simulation run being a corner simulation run performed with all except a selected one of said third number of said statistical process parameter types for a selected one of said first number of said field effect transistor types being set at said corresponding nominal process parameter values and with said selected one of said third number of said statistical process parameter types for said selected one of said first number of said field effect transistor types being set at a corresponding corner process parameter value,
said corresponding corner process parameter value being a given multiple of a corresponding standard deviation associated with said selected one of said third number of statistical parameter types for said selected one of said first number of field effect transistor types, and
said additional simulation runs being performed to determine corner electrical parameter values for said each of said second number of said electrical parameter types for said each of said first number of said field effect transistor types.

19. The computer program product of claim 18, said at least one electrical correlation coefficient being determined by performing the following:
for said each of said second number of said electrical parameter types for said each of said first number of said field effect transistor types, using said corresponding nominal electrical parameter values and said corner electrical parameter values to determine sensitivity values with respect to each of said third number of said statistical process parameter types;

determining variance values using said sensitivity values and said corresponding standard deviations of each of said third number of said statistical process parameter types for each of said first number of field effect transistor types;

when said first number is greater than one, determining process correlation coefficient values among said statistical process parameter types;

determining at least one covariance value using said sensitivity values, said corresponding standard deviations of each of said third number of said statistical process parameter types for each of said first number of field effect transistor types, and said process correlation coefficient values; and, determining said at least one electrical correlation coefficient using said at least one covariance value.

20. The computer program product of claim 17, wherein said using of said at least one electrical correlation coefficient, which was developed using said initial simulation run and said predetermined number of additional simulation runs, to develop said compact model improves system efficiency by eliminating requirements for Monte Carlo simulation runs or hardware measurements.

* * * * *